United States Patent
Koo (10) Patent No.: US 12,477,962 B2
(45) Date of Patent: Nov. 18, 2025

(54) ELECTRONIC DEVICE HAVING RESISTANCE CHANGE PROPERTY

(71) Applicant: SK hynix Inc., Icheon-si (KR)

(72) Inventor: Won Tae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 500 days.

(21) Appl. No.: 17/890,899

(22) Filed: Aug. 18, 2022

(65) Prior Publication Data

US 2023/0309427 A1 Sep. 28, 2023

(30) Foreign Application Priority Data

Mar. 23, 2022 (KR) .................. 10-2022-0036338

(51) Int. Cl.
*H10N 70/00* (2023.01)
*H10N 70/20* (2023.01)

(52) U.S. Cl.
CPC .......... *H10N 70/826* (2023.02); *H10N 70/253* (2023.02); *H10N 70/8845* (2023.02)

(58) Field of Classification Search
CPC ............... H10N 70/826; H10N 70/253; H10N 70/8845; H10N 70/20; H10N 70/24; H10B 63/20

See application file for complete search history.

(56) References Cited

U.S. PATENT DOCUMENTS

| | | | |
|---|---|---|---|
| 7,834,339 B2 | 11/2010 | Bednorz et al. | |
| 2006/0131636 A1* | 6/2006 | Jeon | H01L 29/66825 257/E21.21 |
| 2010/0294424 A1* | 11/2010 | Hart | B82Y 10/00 425/374 |
| 2011/0180907 A1* | 7/2011 | McConnell | H10K 71/191 257/E29.022 |
| 2011/0284931 A1* | 11/2011 | Liu | H01L 29/475 257/280 |
| 2012/0069632 A1* | 3/2012 | Hayakawa | H10B 63/20 257/E47.001 |
| 2016/0093742 A1* | 3/2016 | Momose | H01L 29/41733 257/43 |
| 2017/0047513 A1* | 2/2017 | Rolandi | G11C 13/0069 |
| 2018/0174845 A1* | 6/2018 | Jang | H01L 29/4966 |
| 2021/0406660 A1* | 12/2021 | Chen | G06N 3/049 |

FOREIGN PATENT DOCUMENTS

WO  WO-2021216842 A1 * 10/2021 ......... G11C 13/0007

* cited by examiner

*Primary Examiner* — William B Partridge
*Assistant Examiner* — Erik A. Anderson (57) ABSTRACT

An electronic device according to an embodiment of the present disclosure includes a substrate, a base electrode layer disposed over the substrate, first and second operating electrode layers disposed over the base electrode layer to be spaced apart from each other, a channel layer disposed between the first operating electrode layer and the second operating electrode layer over the base electrode layer, a proton conductive layer disposed over the first and second electrode layers and the channel layer, a hydrogen source layer disposed over the proton conductive layer, and a control electrode layer disposed over the hydrogen source layer.

26 Claims, 11 Drawing Sheets

United States Patent

ELECTRONIC DEVICE HAVING RESISTANCE CHANGE PROPERTY

CROSS-REFERENCE TO RELATED APPLICATIONS

The present application claims priority under 35 U.S.C. § 119(a) to Korean Application No. 10-2022-0036338, filed on Mar. 23, 2022 in the Korean Intellectual Property Office, which is incorporated herein by reference in its entirety.

BACKGROUND

1. Technical Field

The present disclosure generally relates to electronic devices having a resistance change property.

2. Related Art

Recently, resistive memory devices have emerged that store reversibly changing electrical resistance as signal information. The resistive memory devices may be classified into resistance change RAM devices, phase change RAM devices, magnetic change RAM devices, and the like, according to factors causing changes in electrical resistance of the resistance change layer.

Various studies for improving the performance of resistive memory devices are being conducted. Specifically, various studies are being conducted on methods of increasing the number of resistance states that can be implemented in the resistance change layer, increasing the magnitude ratio between the plurality of implemented resistance states, increasing linearity and symmetry between the plurality of implemented resistance states, or increasing the driving speed of a resistive memory device.

SUMMARY

An electronic device according to an embodiment of the present disclosure may include a substrate, a base electrode layer disposed over the substrate, first and second operating electrode layers disposed over the base electrode layer to be spaced apart from each other, a channel layer disposed between the first operating electrode layer and the second operating electrode layer over the base electrode layer, a proton conductive layer disposed over the first and second electrode layers and the channel layer, a hydrogen source layer disposed on the proton conductive layer, and a control electrode layer disposed over the hydrogen source layer.

An electronic device according to another embodiment of the present disclosure may include a substrate, first and second operating electrode layers disposed over the substrate to be paced apart from each other, a channel layer disposed between the first operating electrode layer and the second operating electrode layer over the substrate, a proton conductive layer disposed over the first and second electrode layers and the channel layer, and a control electrode layer disposed over the proton conductive layer.

DETAILED DESCRIPTION

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Figure 1:
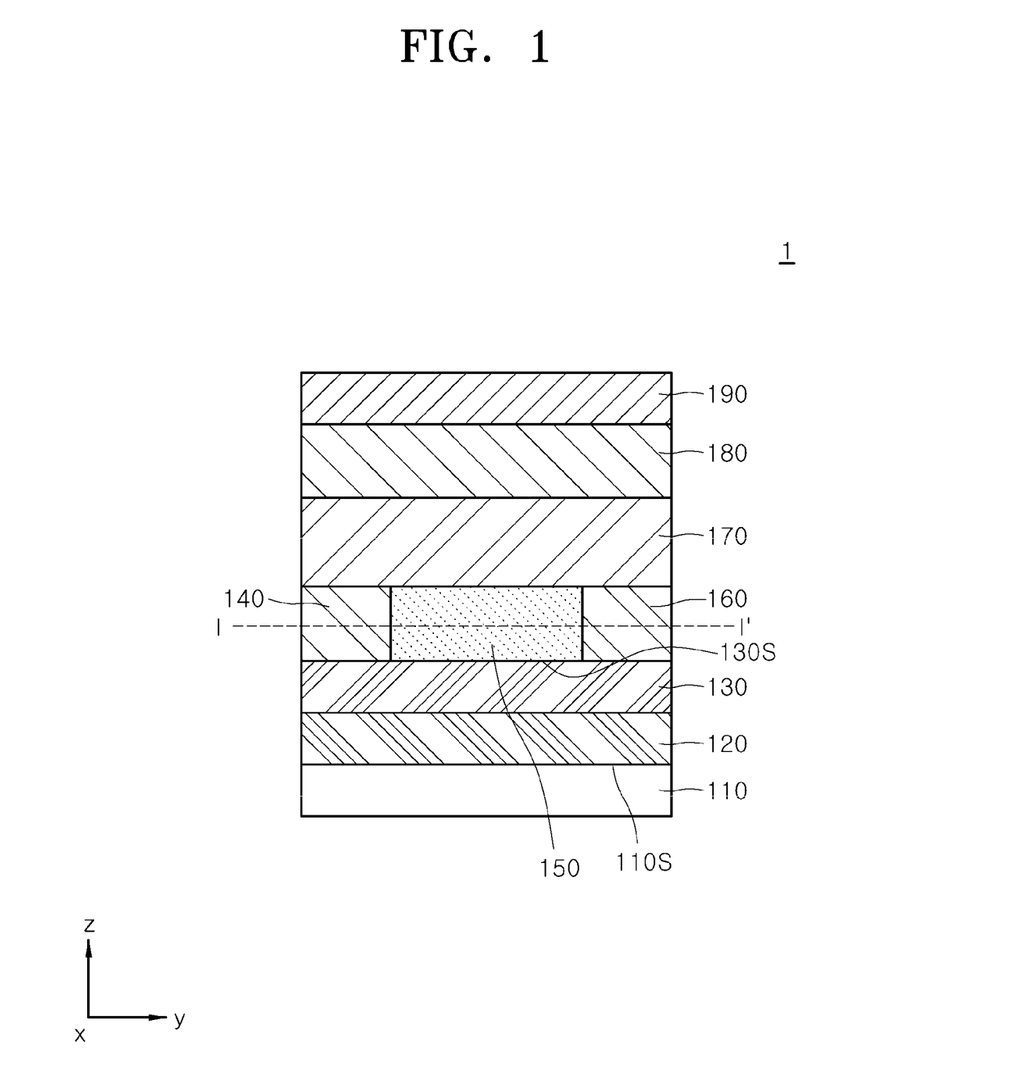
FIG. 1 is a cross-sectional view schematically illustrating an electronic device according to an embodiment of the present disclosure.
Figure 2:
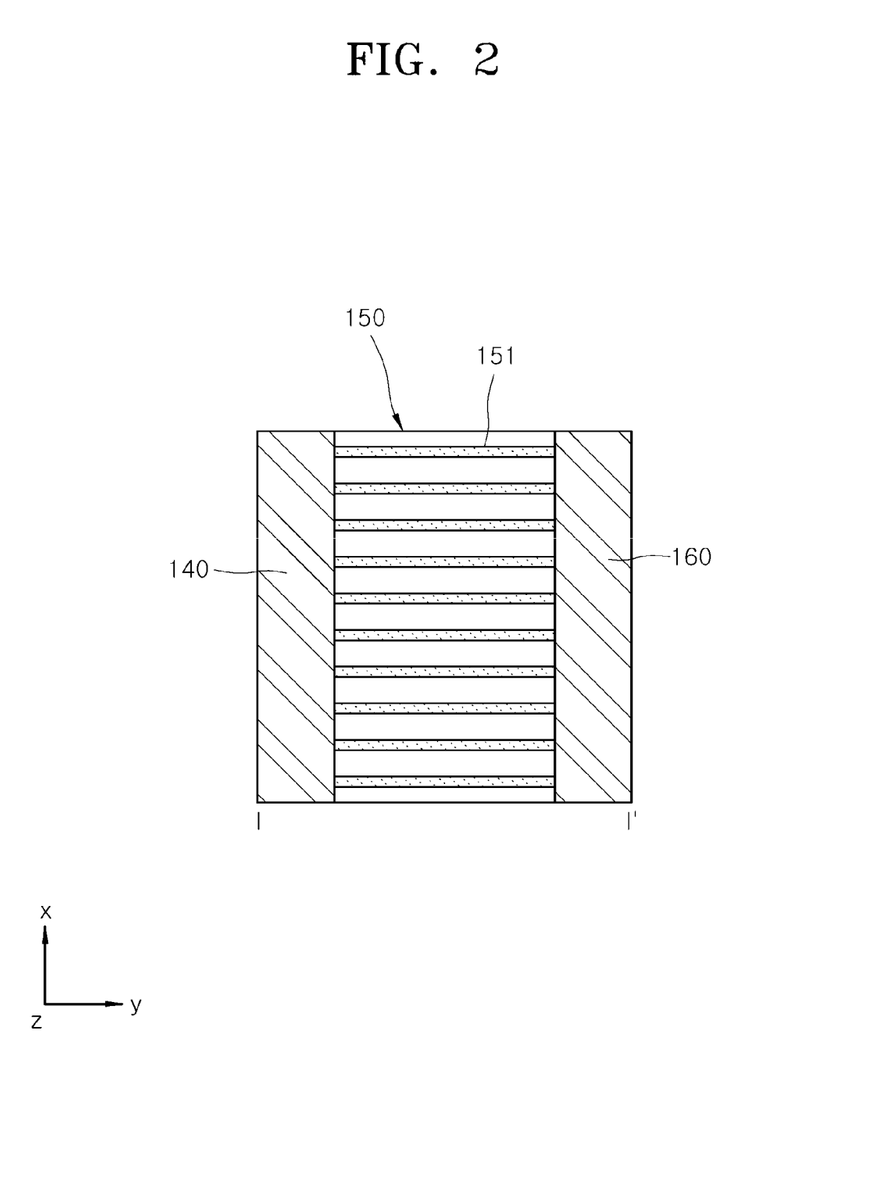
FIG. 2 is a cross-sectional view taken along the line I-I' of an electronic device of FIG. 1.
Figure 3:
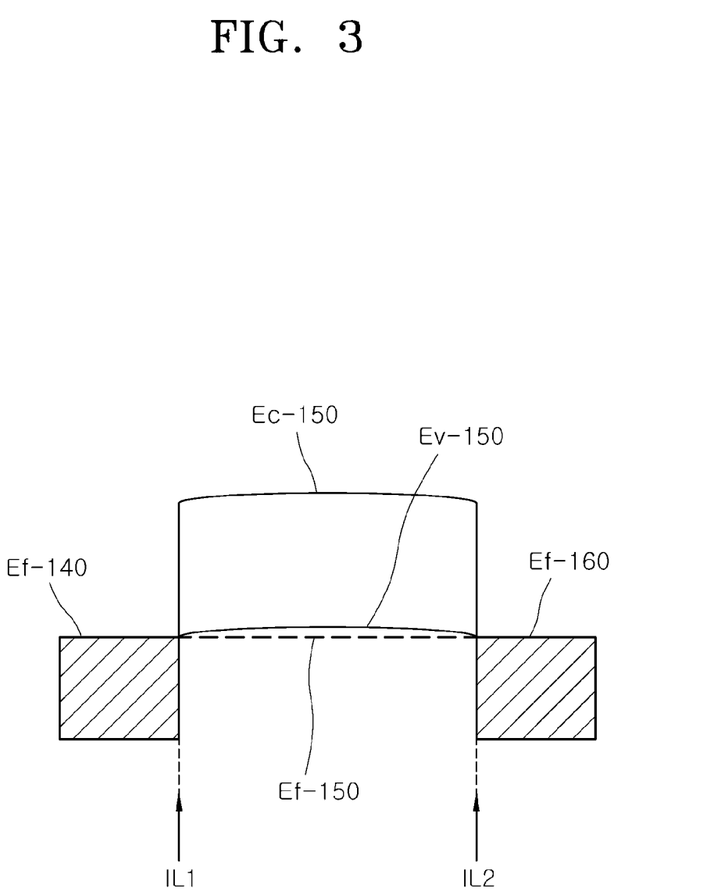
FIGS. 3 and 4 are views schematically illustrating an interfacial energy barrier of an electronic device according to an embodiment of the present disclosure.
Figure 4:
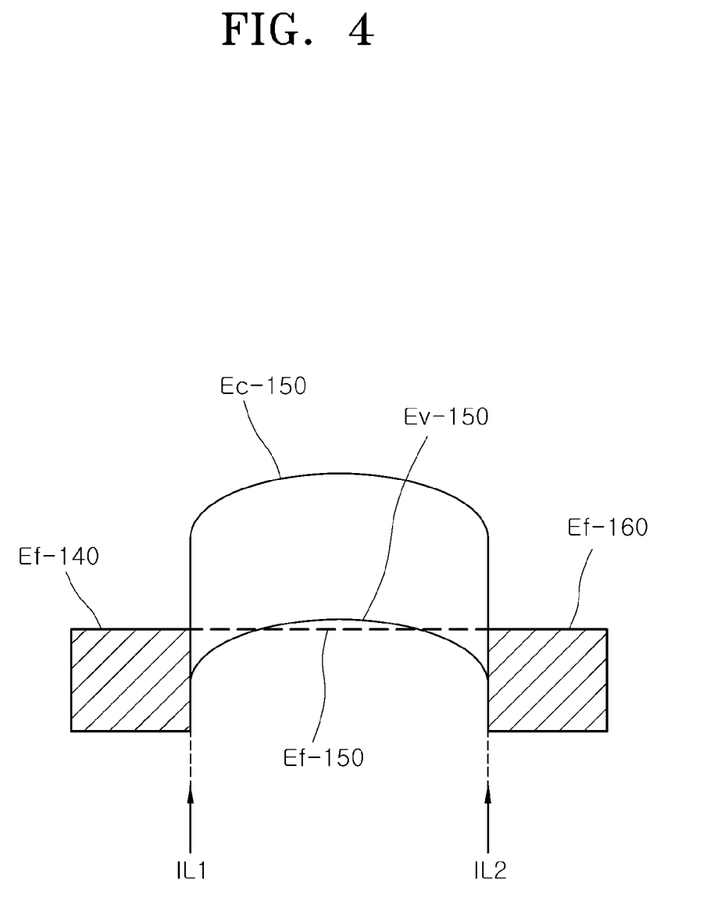

FIG. 1 is a cross-sectional view schematically illustrating an electronic device according to an embodiment of the present disclosure. FIG. 2 is a cross-sectional view taken along the line I-I' of an electronic device 1 of FIG. 1. FIGS. 3 and 4 are views schematically illustrating an interfacial energy barrier of an electronic device according to an embodiment of the present disclosure.

Referring to FIG. 1, an electronic device 1 may include a substrate 110, a base electrode layer 120, first and second operating electrode layers 140 and 160, a channel layer 150, a proton conductive layer 170, a hydrogen source layer 180, and a control electrode layer 190. In addition, the electronic device 1 may include a separating insulation layer 130 disposed between the first and second operating electrode layers 140 and 160 and the base electrode layer 120.

In an embodiment, the substrate 110 may include a semiconductor material. As an example, the substrate 110 may include silicon (Si), gallium arsenide (GaAs), indium phosphide (InP), germanium (Ge), or silicon germanium (SiGe). In another embodiment, the substrate 110 may include an insulating material.

In an example, the substrate 110 may include a ceramic material or a polymer material. The ceramic material may include, for example, silicon oxide, aluminum oxide, or the like. The polymer material may include, for example, polyimide, polyehtlene naphtahalate (PEN), polycarbonate, or the like.

Referring to FIG. 1, the base electrode layer 120 may be disposed on the substrate 110. The base electrode layer 120 may include a conductive material. The conductive material may include, for example, doped semiconductor material, metal, conductive metal nitride, conductive metal oxide, conductive metal silicide, conductive metal carbide, or a combination of two or more thereof. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 1, the separating insulation layer 130 may be disposed on the base electrode layer 120. The separating insulation layer 130 may electrically insulate the first and second operating electrode layers 140 and 160 and the channel layer 150 from the base electrode layer 120. The separating insulation layer 130 may act as an electrical resistor when a voltage is applied between the base electrode layer 120 and the control electrode layer 190. That is, when the voltage is applied between the base electrode layer 120 and the control electrode layer 190, a voltage drop occurs through the separating insulating layer 130. The separating insulation layer 130 may include an insulating material. The insulating material may include, for example, oxide, nitride, oxynitride, or a combination thereof.

The first operating electrode layer 140 and the second operating electrode layer 160 may be disposed to be spaced apart from each other on the separating insulation layer 130. Each of the first and second operating electrode layers 140 and 160 may accept or release hydrogen (H). In this disclosure, hydrogen (H) may be introduced into the first and second operating electrode layers 140 and 160 by an external stimulus, and the hydrogen (H) may remain in the first and second operating electrode layers 140 and 160 even after the external stimulus is removed. Accordingly, the hydrogen (H) introduced into the first and second operating electrode layers 140 and 160 may be retained at a predetermined concentration in the first and second operating electrode layers 140 and 160 unless a new stimulus is generated from an external energy source.

The hydrogen accepted into the first and second operating electrode layers 140 and 160 may have an atomic entity or a diatomic entity. The acceptance or release of hydrogen (H) may be controlled by a voltage applied between the control electrode layer 190 and the base electrode layer 120, as will be described later.

According to an aspect of the present disclosure, the hydrogen may be dissolved in the interstitial sites of the crystal lattice in the first and second operating electrode layers 140 and 160, and thus may be accepted into the first and second operating electrode layers 140 and 160. In addition, the hydrogen (H) may be released from the first and second operating electrode layers 140 and 160 by escaping from the interstitial sites of the crystal lattice of the first and second operating electrode layers 140 and 160.

According to an aspect of the present disclosure, the accepted hydrogen (H) may be combined with metal in the first and second operating electrode layers 140 and 160 to form metal hydride. In addition, the metal hydride may be converted into metal by breaking the bond between the metal and hydrogen (H) and releasing the hydrogen (H). Accordingly, each of the first and second operating electrode layers 140 and 160 may include metal that forms the metal hydride. The metal that forms the metal hydride may include, for example, palladium (Pd) or a palladium (Pd)-based bimetallic compound. The palladium (Pd)-based bimetallic compound may be represented by, for example, the chemical formula of Pd-M, where M may include platinum (Pt), ruthenium (Ru), nickel (Ni), or cobalt (Co). In an embodiment, the first and second operating electrode layers 140 and 160 may be made of the same material. Alternatively, the first and second operating electrode layers 140 and 160 may be made of different materials.

Referring back to FIG. 1, the channel layer 150 may be disposed between the first operating electrode layer 140 and the second operating electrode layer 160. The first and second operating electrode layers 140 and 160 may be disposed on the same plane. As an example, the first and second operating electrode layers 140 and 160 and the channel layer 150 may be disposed on a surface 130S of the separating insulation layer 130, which is parallel to a surface 110S of the substrate 110.

Referring to FIG. 2, the channel layer 150 may include carbon nanotubes 151. Each of the carbon nanotubes 151 may have electrical conductivity. In an embodiment, the channel layer 150 may include carbon nanotubes 151 made of single wall.

The carbon nanotubes 151 may be arranged in the channel layer 150. The carbon nanotubes 151 may be disposed not to contact each other inside the channel layer 150. That is, a single carbon nanotube 151 may be disposed to directly connect the first operating electrode layer 140 and the second operating electrode layer 160 without contacting other carbon nanotubes. Accordingly, contact resistance generated by the contact between the carbon nanotubes 151 may be prevented.

When a voltage is applied between the first operating electrode layer 140 and the second operating electrode layer 160, conductive carriers may conduct through the carbon nanotubes 151. The conductive carriers may be, for example, holes having a positive charge. The single carbon nanotubes 151 may each have a length equal to or less than a mean free path of the conductive carrier. Accordingly, the conductive carriers may conduct the channel layer 150 without substantially colliding with each other. Through the above-described arrangement of the carbon nanotubes 151, the conduction speed of the conductive carrier may be increased. The conduction method of the conductive carrier may include, for example, a ballistic transport method or a quasi-ballistic transport method.

Referring back to FIG. 1, when the first and second operating electrode layers 140 and 160 accept the hydrogen (H), the work function of each of the first and second operating electrode layers 140 and 160 may be decreased. Conversely, when the first and second operating electrode layers 140 and 160 release the hydrogen (H), the work function of each of first and second operating electrode layers 140 and 160 may be increased. In comparison, the channel layer 150 may accept the hydrogen (H) or release the hydrogen (H), but the acceptance and release of the hydrogen (H) without substantially changing the work function of the channel layer 150.

FIG. 3 schematically illustrates energy barriers of the interfaces formed by the first and second operating electrode layers 140 and 160 and the channel layer 150 of FIG. 1 when hydrogen (H) is not accepted in the first and second operating electrode layers 140 and 160 and the channel layer 150, or when hydrogen (H) is released from the first and second operating electrode layers 140 and 160 and the channel layer 150. FIG. 3 illustrates the Fermi energy levels Ef-140 and Ef-160 of the first and second operating electrode layers 140 and 160 of FIG. 1, respectively, and the Fermi energy level Ef-150, the valence band energy level Ev-150, and the conduction band energy level Ec-150 of the channel layer 150 of FIG. 1.

Referring to FIG. 3, a first interface IL1 between the first operating electrode layer 140 and the channel layer 150 and a second interface IL2 between the second operating electrode layer 160 and the channel layer 150 may form ohmic contacts. That is, the work functions of the first operating electrode layer 140 and the channel layer 150 may be close enough to form an ohmic contact, or put another way, a difference in work functions between the first operating electrode layer 140 and the channel layer 150 may be sufficiently small or de minimis so that the difference cannot prevent formation of the ohmic contact. Similarly, the work functions of the second operating electrode layer 160 and the channel layer 150 may be close enough to form an ohmic contact, or a difference in work functions between the second operating electrode layer 160 and the channel layer 150 may be sufficiently small or de minimis so that the difference cannot prevent formation of the ohmic contact.

Figure 6:
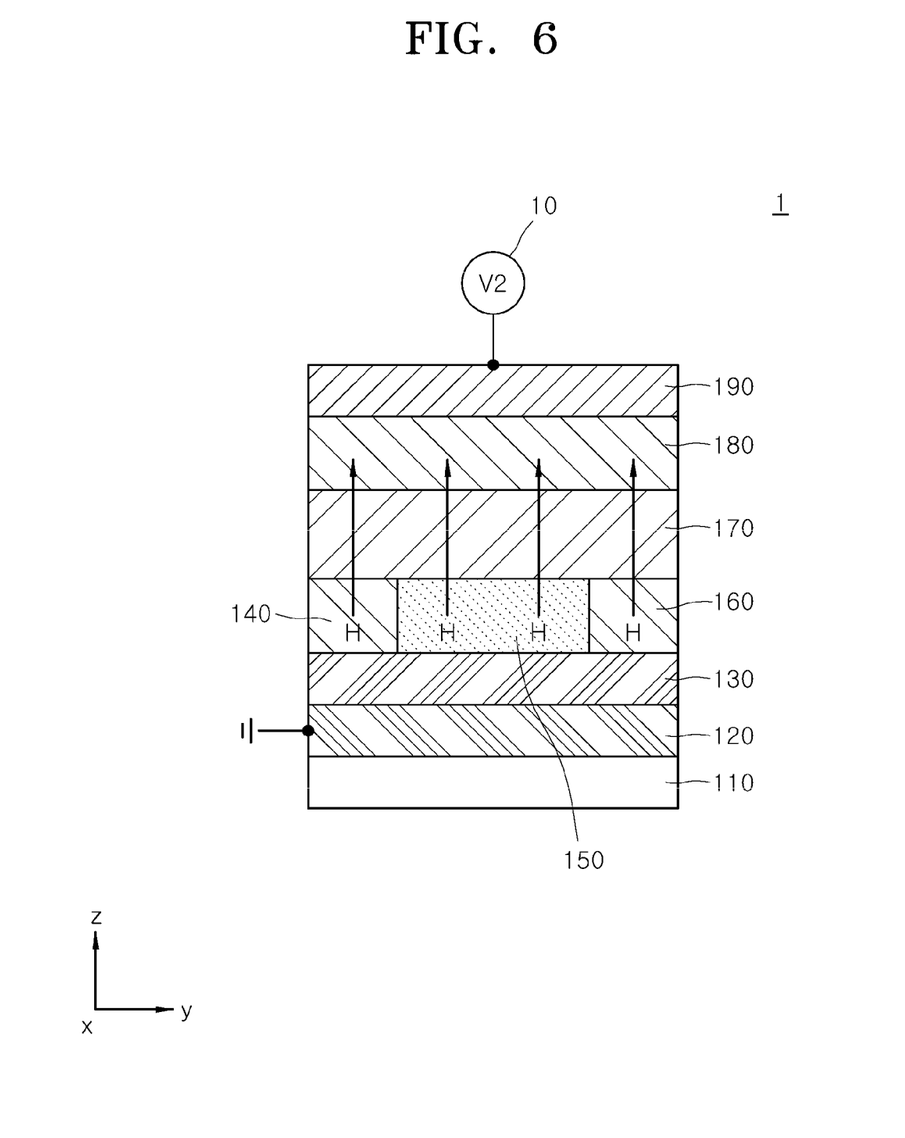

The state in which the hydrogen (H) is not accepted or the hydrogen (H) is released shown in FIG. 3 may mean an initial state in which hydrogen (H) is not artificially provided to the first and second operating electrode layers 140 and 160 and the channel layer 150, that is, a state immediately after the electronic device 1 is manufactured, or a state in which a second write operation, which will be described later with reference to FIG. 6, is performed.

Figure 5:
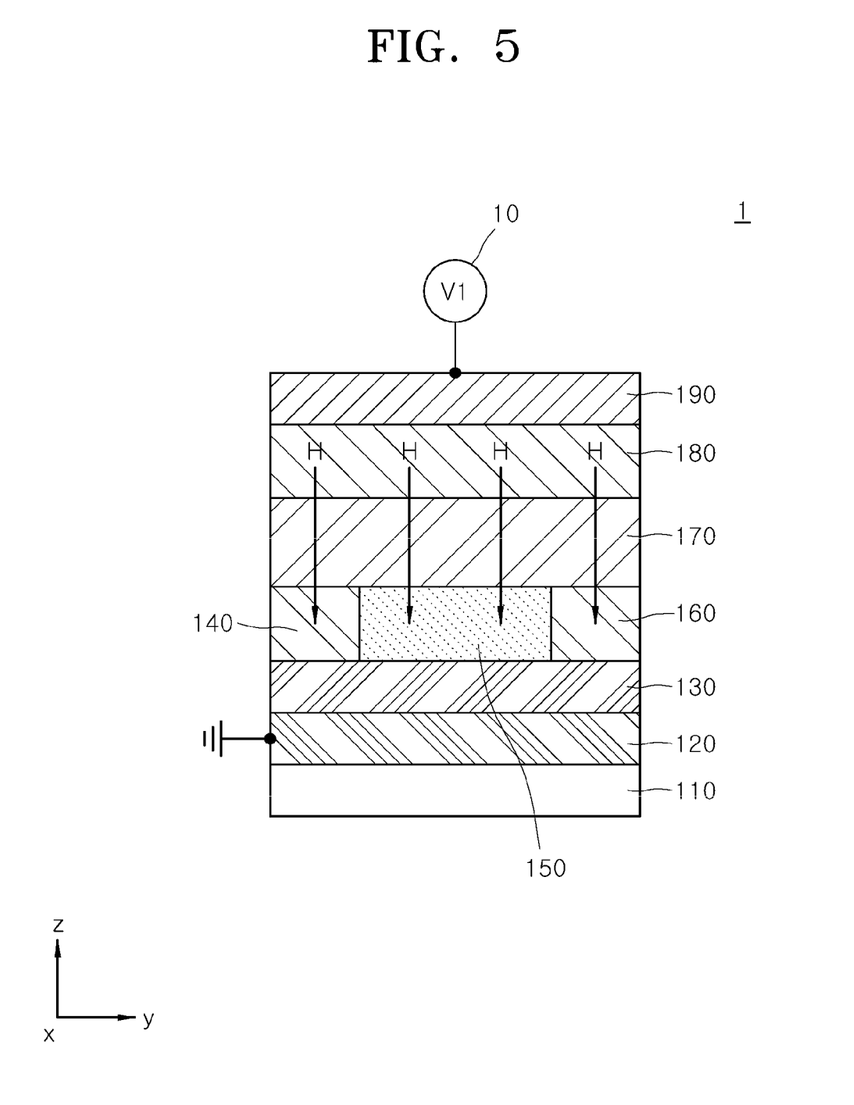
FIGS. 5 and 6 are views schematically illustrating a write operation of an electronic device according to an embodiment of the present disclosure.

FIG. 4 schematically illustrates energy barriers of the interfaces formed by the first and second operating electrode layers 140 and 160 and the channel layer 150 when hydrogen (H) is accepted in the first and second operating electrode layers 140 and 160 and the channel layer 150. When the hydrogen (H) is accepted, the work functions of the first and second operating electrode layers 140 and 160 may be decreased. The amount of the decrease in the work function may be proportional to the amount of the hydrogen (H) accepted. In FIG. 4, the state in which hydrogen (H) is accepted may mean the state in which a first write operation, which will be described later with reference to FIG. 5, is performed.

In an embodiment, when each of the first and second operating electrode layers 140 and 160 includes palladium (Pd) and the channel layer 150 includes carbon nanotubes, in the non-hydrogen (H) acceptance state of FIG. 3, the palladium (Pd) may have a work function of about 5.1 eV, and the carbon nanotubes may have a work function of about 4.8 eV to 5.0 eV. In the hydrogen (H)-acceptance state of FIG. 4, when the palladium (Pd) is converted into palladium hydride (PdHx, 0<x<1), the work function of the palladium hydride may decrease to about 3.2 eV. The carbon nanotubes maintain the work function of about 4.8 eV to 5.0 eV in the hydrogen (H)-acceptance state. Accordingly, in FIG. 4, energy barriers with respect to the conductive carriers (i.e., the holes having a positive charge) may be generated by the bending of the energy band at the first interface IL1 and the second interface IL2. In proportion to the degree of decrease in the work function of the palladium hydride, the magnitude of each of the energy barriers may be increased. As a result, upon the acceptance of the hydrogen (H), each of the electrical contact at the first interface IL1 and the electrical contact at the second interface IL2 may be converted into Schottky contact for the conductive carriers (i.e., holes having a positive charge).

Thereafter, when the hydrogen (H) is released from the first and second operating electrode layers 140 and 160 and the channel layer 150, as shown in FIG. 3, the electrical contacts at the first interface IL1 and the second interface IL2 may be converted into ohmic contacts with respect to the conductive carrier.

Referring back to FIG. 1, the proton conductive layer 170 may be disposed on the first and second operating electrode layers 140 and 160 and the channel layer 150. The proton conductive layer 170 may include a solid electrolyte material conducting hydrogen (H) in the form of protons. The proton conductive layer 170 may exchange hydrogen ions with the first and second operating electrode layers 140 and 160 and the channel layer 150. The hydrogen ion may be converted into an atomic entity or diatomic entity in the first and second operating electrode layers 140 and 160 and the channel layer 150.

The proton conductive layer 170 may include a proton exchange polymer, a metal-organic framework (hereinafter, referred to as "MOF"), a covalent-organic framework (hereinafter, referred to as "COF"), sulfonated graphene, polymer-graphene composites, or a combination of two or more thereof.

As an example, the proton exchange polymer may include sulfonated tetrafluoroethylene-based fluoropolymer-copolymer, polystyrene-based membranes, sulfonated polyimide (SPI)-based membranes, polyphosphazene-based membranes, polybenzimidazole (PBI)-based membranes, or the like. As another example, the MOF may be sulfonated MOF or polymer-MOF composites. In this case, the metal salt forming the MOF may include a salt having a chemical formula such as $Zn_4O(CO_2)_6$, $Zn_3O(CO_2)_6$, $Cr_3O(CO_2)_6$, $In_3O(CO_2)_6$, $Ga_3O(CO_2)_6$, $Cu_2O(CO_2)_4$, $Zn_2O(CO_2)_4$, $Fe_2O(CO_2)_4$, $Mo_2O(CO_2)_4$, $Cr_2O(CO_2)_4$, $CO_2O(CO_2)_4$, $Ru_2O(CO_2)_4$, or the like. The organic ligand forming the MOF may include oxalic acid, fumaric acid, $H_2BDC$, $H_2BDC$—Br, $H_2BDC$—OH, $H_2BDC$—NO2, $H_2BDC$—$NH_2$, $H_4DOT$, $H_2BDC$—$(Me)_2$, $H_2BDC$—$(Cl)_2$ and the like. As further another example, the COF may be a sulfonated COF or polymer-COF composites.

Referring to FIG. 1, the hydrogen source layer 180 may be disposed on the proton conductive layer 170. The hydrogen source layer 180 may contain hydrogen (H) and may serve to provide hydrogen (H) to the proton conductive layer 170. As an example, the hydrogen (H) may have an atomic entity or diatomic entity. The hydrogen source layer 180 may include, for example, metal hydride or hydrogen-containing semiconductor material. The metal hydride may be, for example, the hydride of palladium (Pd), magnesium (Mg), or yttrium (Y). The hydrogen-containing semiconductor material may include, for example, hydrogen-containing silicon (Si) or hydrogen-containing gallium arsenide (GaAs). When a hydrogen-containing semiconductor material is used in the hydrogen source layer 180, the hydrogen source layer 180 may contain hydrogen (H) by injecting hydrogen (H) into the layer of the semiconductor material in the process of forming the layer of the semiconductor material. Examples of methods of injecting hydrogen (H) include a diffusion method or an ion implantation method.

Referring to FIG. 1, the control electrode layer 190 may be disposed on the hydrogen source layer 180. The control electrode layer 190 may include a conductive material. The conductive material may include, for example, doped semiconductor, metal, conductive metal oxide, conductive metal nitride, conductive metal silicide, conductive metal carbide, or a combination of two or more thereof. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

By an operation voltage of a first polarity (e.g., positive polarity) applied between the control electrode layer 190 and the base electrode layer 120, the hydrogen (H) of the hydrogen source layer 180 may move to the first and second operating electrode layers 140 and 160 and the channel layer 150 through the proton conductive layer 170, and then may be accepted in the first and second operating electrode layers 140 and 160 and the channel layer 150. In addition, by an operation voltage of a second polarity (e.g., negative polarity) applied between the control electrode layer 190 and the base electrode layer 120, the hydrogen (H) may be released from the first and second operating electrode layers 140 and 160 and the channel layer 150, and then may move to the hydrogen source layer 180 through the proton conductive layer 170.

As the first and second operating electrode layers 140 and 160 accept or release the hydrogen (H), the work functions of the first and second operating electrode layers 140 and 160 may change. On the other hand, regardless the acceptance or release of hydrogen (H), the work function of the channel layer 150 is not affected or might not substantially change.

As described above, electronic devices according to embodiments of the present disclosure may include first and second operating electrode layers spaced apart from each other, and a channel layer disposed between the first and second operating electrode layers, over a substrate. In addition, the electronic devices may include a proton conductive layer for exchanging hydrogen (H) with the first and second operating electrode layers and the channel layer, and a hydrogen source layer for providing hydrogen (H) to the proton conductive layer. In addition, the electronic devices may include a base electrode layer and a control electrode layer for electrically controlling the hydrogen (H) exchange.

According to embodiments of the present disclosure, when the first and second operating electrode layers accept or release hydrogen (H), the work functions of the first and second operating electrode layers may be changed. Accordingly, the electrical contact characteristics at a first interface between the first operating electrode layer and the channel layer and at a second interface between the second operating electrode layer and the channel layer may also change. As a result, according to embodiments of the present disclosure, the conductivity of the channel layer conducting conductive carriers between the first and second operating electrode layers changes when the first and second operating electrode layers accept or release the hydrogen (H). That is, by using the characteristic in which the contact characteristics of the first and second interfaces are changed according to the acceptance or release of the hydrogen (H), an electronic device storing different signal information may be provided.

Figure 7:
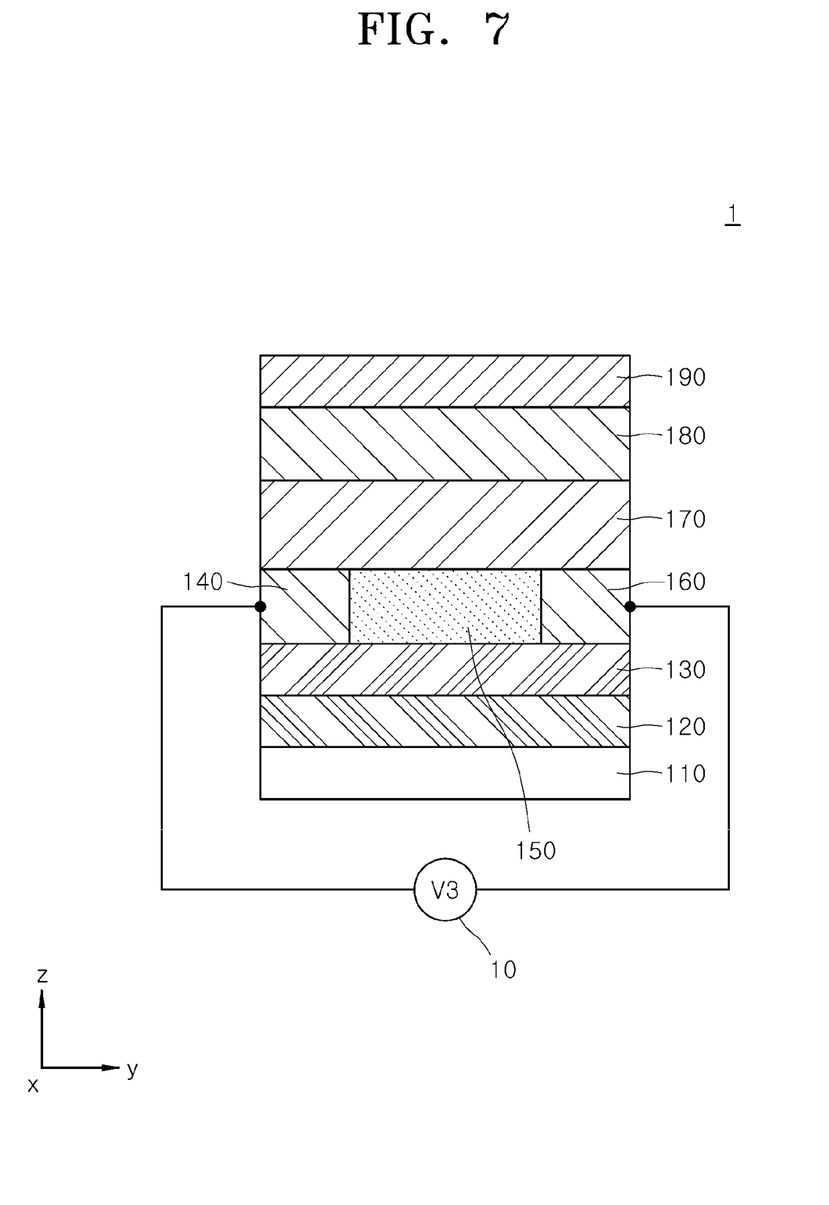
FIG. 7 is a view schematically illustrating a read operation of an electronic device according to an embodiment of the present disclosure.

FIGS. 5 and 6 are views schematically illustrating a write operation of an electronic device according to an embodiment of the present disclosure. FIG. 7 is a view schematically illustrating a read operation of an electronic device according to an embodiment of the present disclosure. The write operation and the read operation of the electronic device according to the present embodiment may be applied to the operations of the electronic device 1 of FIG. 1.

Referring to FIGS. 5, 6, and 7, an electronic device 1 according to an embodiment of the present disclosure may operate as a memory device that utilizes a contact characteristics at interfaces to store different signal information. FIG. 5 may be a view illustrating a first write operation of writing a high resistance state in the electronic device 1. FIG. 6 may be a view illustrating a second write operation of writing a low resistance state in the electronic device 1. FIG. 7 may be a view illustrating a read operation of reading a resistance state written in the electronic device 1.

Referring to FIG. 5, a power source 10 may be connected to the electronic device 1. The first write operation may be performed by applying a first write voltage V1 having a positive bias to the first control electrode layer 190 in a state in which the base electrode layer 120 is grounded.

Under the positive bias applied to the control electrode layer 190, the hydrogen (H) in the hydrogen source layer 180 may move to the first and second operating electrode layers 140 and 160 and the channel layer 150 through the proton conductive layer 170. In an embodiment, inside the hydrogen source layer 180, the hydrogen (H) may exist in the form of an atomic entity or a diatomic entity. The hydrogen (H) inside the hydrogen source layer 180 may be converted into proton form by the first write voltage V1, and then, may introduced into the first and second operating electrode layers 140 and 160 and the channel layer 150 by passing through the proton conductive layer 170. The protons introduced into the first and second operating electrode layers 140 and 160 and the channel layer 150 may be converted to hydrogen (H) in the first and second operating electrode layers 140 and 160 and the channel layer 150, and then, may be accepted into the first and second operating electrode layers 140 and 160 and the channel layer 150.

The hydrogen (H) may be dissolved in the metal in the first and second operating electrode layers 140 and 160. The hydrogen (H) may be disposed in the interstitial sites inside the crystal lattice of the metal. In an embodiment, the hydrogen (H) may form a metallic bonding with the metal. In an embodiment, the hydrogen (H) may react with the metal to form metal hydride.

In an embodiment, the first write voltage V1 may supply hydrogen (H) up to an upper limit of the solid solubility of hydrogen (H) that can be dissolved by the metal of the first and second operating electrode layers 140 and 160. In an embodiment, the concentration of the hydrogen (H) introduced into the first and second operating electrode layers 140 and 160 may be controlled by controlling the magnitude of the positive bias of the first write voltage V1. In another embodiment, the concentration of the hydrogen (H) introduced into the first and second operating electrode layers 140 and 160 may be controlled by controlling the time period during which the first write voltage V1 is applied. After the first write voltage V1 is removed, the first and second operating electrode layers 140 and 160 may maintain the concentration of hydrogen (H) dissolved in the metal.

As described above with reference to FIG. 4, when the hydrogen (H) is accepted in the first and second operating electrode layers 140 and 160, the work functions of the first and second operating electrode layers 140 and 160 may be decreased. The decrease in the work function may be proportional to the amount of the accepted hydrogen (H). On the other hand, despite the acceptance of the hydrogen (H), the work function of the channel layer 150 might not substantially be changed. Accordingly, energy barriers may be formed or the size of each of the energy barriers may be increased at the first interface IL1 formed by the first operating electrode layer 140 and the channel layer 150 and at the second interface IL2 formed by the second operating electrode layer 160 and the channel layer 150 with respect to the conductive carrier (i.e., hole having a positive charge). That is, at each of the first interface IL1 and the second interface IL2, a Schottky contact to the conductive carrier may be formed. In addition, the state of the Schottky contact at each of the first and second interfaces IL1 and IL2 may be non-volatilely stored in the electronic device 1. The state of the Schottky contact may increase the electrical resistance at each of the first and second interfaces IL1 and IL2 during a read operation, which will be described later with reference to FIG. 7. Accordingly, the state of the Schottky contact may function as first signal information in the electronic device 1.

In an embodiment, the concentration of the hydrogen (H) accepted in the first and second operating electrode layers 140 and 160 may be controlled by controlling at least one of the magnitude of the positive bias of the first write voltage V1 and the application time of the first write voltage V1. In addition, after the first write voltage V1 is removed, the first and second operating electrode layers 140 and 160 may substantially maintain any of a plurality of different hydrogen concentrations. Accordingly, the first and second operating electrode layers 140 and 160 and the channel layer 150 may non-volatilely store the magnitudes of the energy barriers of the Schottky contacts corresponding to the plurality of different hydrogen concentrations. Accordingly, it is possible to have a plurality of pieces of first signal information proportional to the magnitude of the energy barrier of the Schottky contact.

Referring to FIG. 6, the second write operation may be performed by applying a second write voltage V2 having a negative bias to the control electrode layer 190. Under the negative bias, the hydrogen (H) inside the first and second operating electrode layers 140 and 160 and the channel layer 150 may be released from the first and second operating electrode layers 140 and 160 and the channel layer 150. The hydrogen (H) may move to the hydrogen source layer 180 through the proton conductive layer 170.

In an embodiment, the hydrogen (H) inside the first and second operating electrode layers 140 and 160 and the channel layer 150 may be converted into the form of a proton, and then may be introduced into the hydrogen source layer 180 by passing through the proton conductive layer 170. The protons introduced into the hydrogen source layer 180 may be converted into hydrogen (H) in the hydrogen source layer 180, and then, may be accepted in the hydrogen source layer 180. In the hydrogen source layer 180, the hydrogen (H) may have the form of an atomic entity or a diatomic entity.

When the hydrogen (H) is released from the first and second operating electrode layers 140 and 160, the work functions of the first and second operating electrode layers 140 and 160 may increase. The increase in the work function may be proportional to the amount of the released hydrogen (H). On the other hand, regardless of the release of the hydrogen (H), the work function of the channel layer 150 might not substantially change. Accordingly, as illustrated in FIG. 3, the energy barriers may be lowered at the first interface IL1 formed by the first operating electrode layer 140 and the channel layer 150 and at the second interface IL2 formed by the second operating electrode layer 160 and the channel layer 150 with respect to the conductive carrier (i.e., hole having a positive charge). Accordingly, ohmic contacts may be formed at each of the first interface IL1 and the second interface IL2. In addition, the state of the ohmic contacts at the first and second interfaces IL1 and IL2 may be non-volatilely stored in the electronic device 1. The state of the ohmic contacts may reduce the electrical resistance at each of the first and second interfaces IL1 and IL2 during a read operation, which will be described later with reference to FIG. 7. Accordingly, the state of the ohmic contacts may function as second signal information in the electronic device 1.

In an embodiment, after performing the second write operation, the hydrogen (H) concentration in the first and second operating electrode layers 140 and 160 may reach a predetermined lower limit. Accordingly, the second write operation may function as a reset operation of removing the hydrogen (H) introduced into the channel layer 150 through the first write operation.

In another embodiment, when the second write operation is performed after performing the first write operation, the second write operation may be controlled to control the magnitude of the energy barriers of the Schottky contacts at the first and second interfaces IL1 and IL2 formed through the first write operation. That is, it is possible to adjust the degree of reduction of the energy barrier of the Schottky contact by controlling the second write operation. Accordingly, Schottky contacts having various energy barrier magnitudes may be formed at the first and second interfaces IL1 and IL2. Through this, the second write operation may write a plurality of pieces of signal information separately from the first write operation. The plurality of pieces of signal information may correspond to Schottky contacts having the various energy barrier magnitudes.

Referring to FIG. 7, a read operation of the electronic device 1 may be performed. A power source 10 may apply a read voltage V3 between the first operating electrode layer 140 and the second operating electrode layer 160 of the electronic device 1. The read operation may be performed as a process of reading a current flowing through the channel layer 150 by the read voltage V3.

As described above, the electrical contacts at the first and second interfaces IL1 and IL2 (shown in FIGS. 3 and 4) may vary depending on the hydrogen (H) concentration accepted into the first and second operating electrode layers 140 and 160 and the channel layer 150. The electrical conduction of the conductive carrier when the electrical contacts are ohmic contacts may be greater than the electrical conduction of the conductive carrier when the electrical contacts are Schottky contacts. In addition, with respect to the conductive carrier, as the magnitude of each of the energy barriers of the Schottky contacts at the first and second interfaces IL1 and IL2 is increased, the electrical conduction of the conductive carrier conducting the channel layer 150 may be decreased. Accordingly, signal information written in the electronic device 1 may be read by measuring the electrical conduction of the conductive carrier conducting the channel layer 150.

Figure 8:
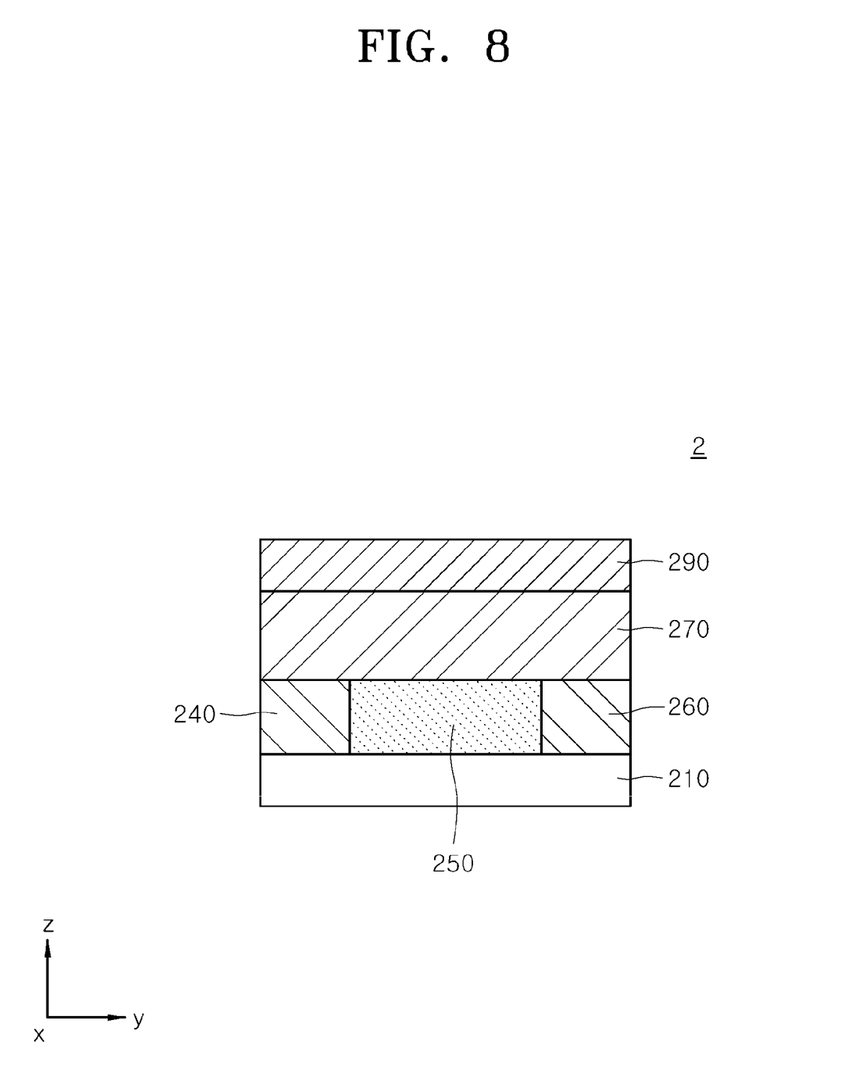
FIG. 8 is a view schematically illustrating an electronic device according to another embodiment of the present disclosure.
Figure 9:
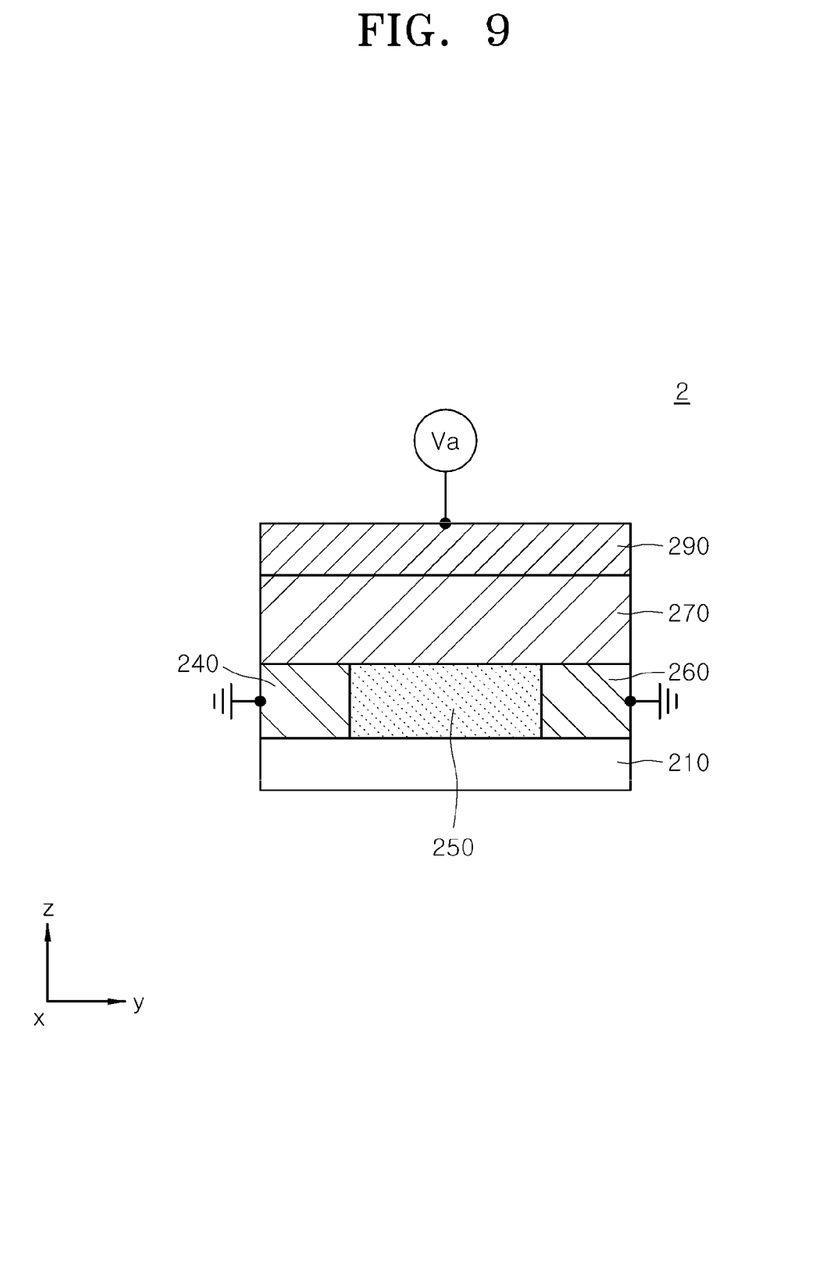
FIG. 9 is a view schematically illustrating a write operation of an electronic device according to another embodiment of the present disclosure.
Figure 10:
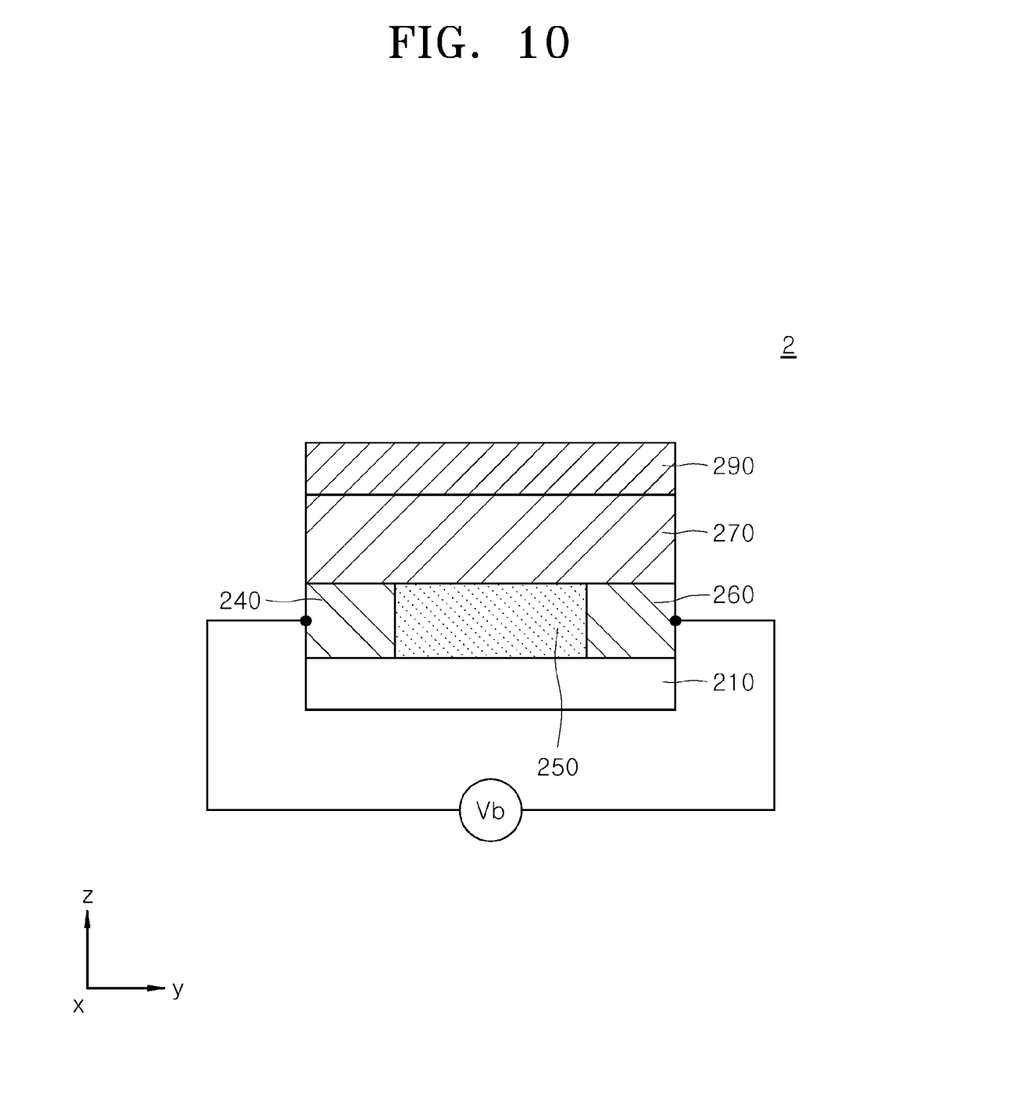
FIG. 10 is a view schematically illustrating a read operation of an electronic device according to another embodiment of the present disclosure.

FIG. 8 is a view schematically illustrating an electronic device according to another embodiment of the present disclosure. FIG. 9 is a view schematically illustrating a write operation of an electronic device according to another embodiment of the present disclosure. FIG. 10 is a view schematically illustrating a read operation of an electronic device according to another embodiment of the present disclosure.

Referring to FIG. 8, compared to an electronic device 1 of FIG. 1, an electronic device 2 may have a configuration in which the base electrode layer, the separating insulation layer, and the hydrogen source layer are omitted. Instead, the electronic device 2 may include a substrate 210, first and second operating electrode layers 240 and 260, a channel layer 250, a proton conductive layer 270, and a control electrode layer 290.

The substrate 210 may be substantially the same as the substrate 110 of the electronic device 1 of FIG. 1. However, when the substrate 210 includes a semiconductor material, the electrical conductivity of the substrate 210 may be lower than the electrical conductivity of the channel layer 250.

The first and second operating electrode layers 240 and 260 and the channel layer 250 may be disposed over the substrate 210. The materials, structures, and electrical properties of the first and second operating electrode layers 240 and 260 and the channel layer 250 may be substantially the same as the materials, structures, and electrical properties of the first and second operating electrode layers 140 and 160 and the channel layer 150 of the electronic device 1 of FIG. 1, respectively.

The proton conductive layer 270 may be disposed on the first and second operating electrode layers 240 and 260 and the channel layer 250. The control electrode layer 290 may be disposed on the proton conductive layer 270. The materials, structures, and electrical properties of the proton conductive layer 270 and the control electrode layer 290 may be substantially the same as the materials, structures, and electrical properties of the proton conductive layer 170 and the control electrode layer 190 of the electronic device 1 of FIG. 1, respectively.

The proton conductive layer 270 may perform the functions of both the proton conductive layer 170 and the hydrogen source layer 180 of the electronic device 1 of FIG. 1. To this end, the proton conductive layer 270 may further include sufficient hydrogen (H) to function as the hydrogen source layer 180, compared to the proton conductive layer 170 of FIG. 1. The hydrogen (H) may be injected into the proton conductive layer 270 when the proton conductive layer 270 is formed on the first and second operating electrode layers 240 and 260 and the channel layer 250. The hydrogen (H) may be injected by using a diffusion method or an ion implantation method. The hydrogen (H) may have the form of, for example, a proton, an atomic entity, or a diatomic entity in the proton conductive layer 270.

Referring to FIG. 9, a write operation of the electronic device 2 may be performed by applying a write voltage Va to the control electrode layer 290, while the first and second operating electrode layers 240 and 260 are grounded. The write voltage Va may have a positive bias or a negative bias. In some embodiments, the write voltage Va may be applied to the control electrode layer 290, while one of the first and second operating electrode layers 240 and 260 is grounded. In this case, the amount of the hydrogen (H) accepted into or released from the grounded operating electrode layer may be greater than the amount of the hydrogen (H) accepted into or released from the non-grounded operating electrode layer.

Referring to FIG. 10, a read operation of the electronic device 2 may be performed by applying a read voltage Vb between the first and second operating electrode layers 240 and 260. The conduction of the conductive carrier conducting the channel layer 250 may be changed according to the type of the electrical contacts formed at the interface between the first operating electrode layer 240 and the channel layer 250 and at the interface between the second operating electrode layer 260 and the channel layer 250. It is possible to read signal information stored in the electronic device 2 by measuring the conduction of the conductive carrier.

Figure 11:
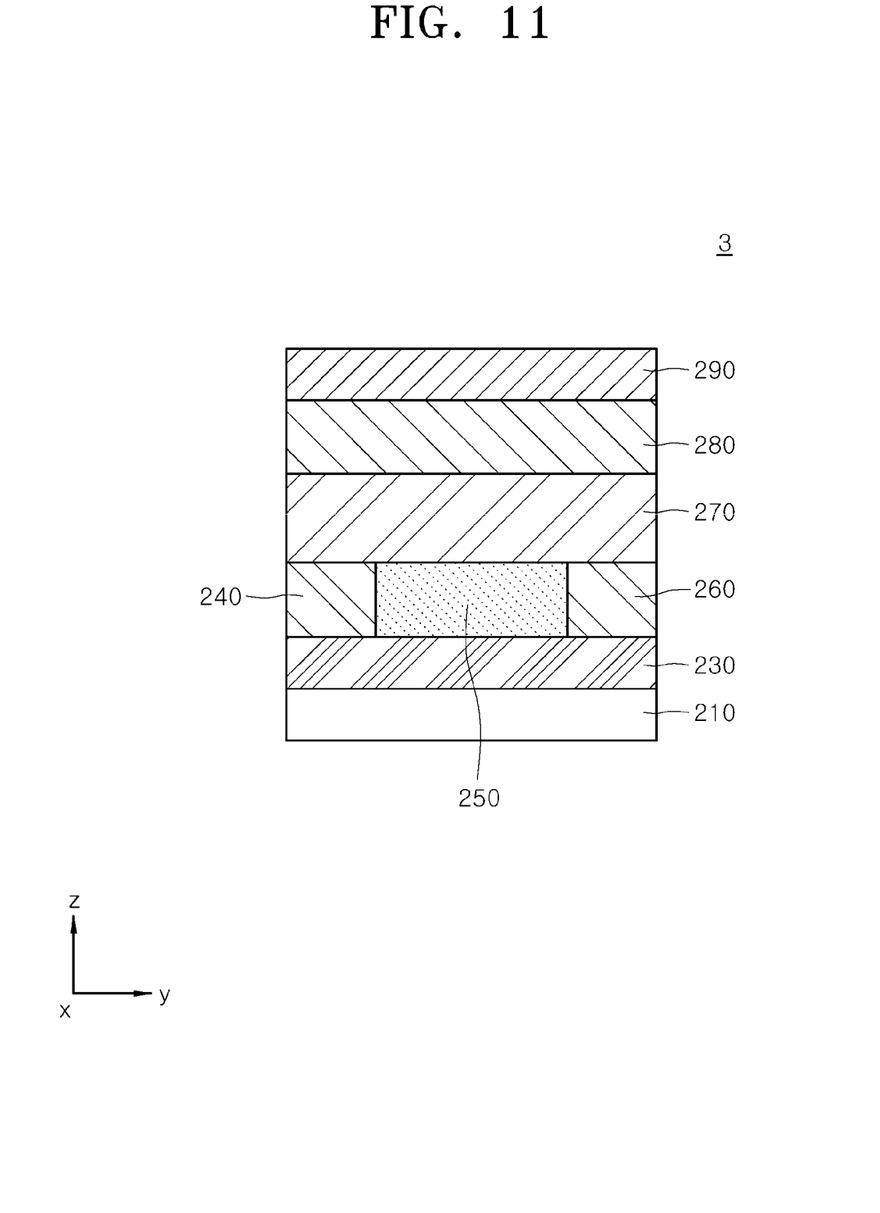
FIG. 11 is a view schematically illustrating an electronic device according to yet another embodiment of the present disclosure.

FIG. 11 is a view schematically illustrating an electronic device according to yet another embodiment of the present disclosure. Referring to FIG. 11, an electronic device 3 may further include an interlayer insulation layer 230 and a hydrogen source layer 280, compared to an electronic device 2 of FIG. 8.

The interlayer insulation layer 230 may be disposed between a substrate 210 and first and second operating electrode layers 240 and 260 and a channel layer 250. The interlayer insulation layer 230 may electrically insulate the substrate 210 from the first and second operating electrode layers 240 and 260 and the channel layer 250.

The hydrogen source layer 280 may be disposed between a proton conductive layer 270 and a control electrode layer 290. Accordingly, the configurations of the proton conductive layer 270 and the hydrogen source layer 280 may be substantially the same as the configurations of the proton conductive layer 170 and the hydrogen source layer 180 of the electronic device 1 of FIG. 1.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. An electronic device comprising:
   a substrate;
   a base electrode layer disposed over the substrate;
   first and second operating electrode layers disposed over the base electrode layer to be spaced apart from each other;
   a channel layer disposed between the first operating electrode layer and the second operating electrode layer over the base electrode layer;
   a proton conductive layer disposed over the first and second operating electrode layers and the channel layer;
   a hydrogen source layer disposed over the proton conductive layer; and
   a control electrode layer disposed over the hydrogen source layer,
   wherein each of the first and second operating electrode layers comprises metal having a work function that changes according to acceptance or release of hydrogen (H),
   wherein the channel layer comprises at least one carbon nanotube having a work function that remains unchanged according to acceptance or release of hydrogen (H), and
   wherein the at least one carbon nanotube electrically connects the first operating electrode layer and the second operating electrode layer, and contacts both the first and second operating electrode layers.

2. The electronic device of claim 1, wherein electrical conductivity of the channel layer conducting a conductive carrier between the first operating electrode layer and the second operating electrode layer changes when the first and second operating electrode layers accept or release the hydrogen (H).

3. The electronic device of claim 2, wherein the conductive carrier is a hole having a positive charge.

4. The electronic device of claim 1, wherein when the first and second operating electrode layers accept hydrogen (H), a magnitude of an energy barrier of a first interface formed between the first operating electrode layer and the channel layer and a magnitude of an energy barrier of a second interface formed between the second operating electrode layer and the channel layer are increased.

5. The electronic device of claim 4, wherein according to the acceptance of the hydrogen (H), an electrical contact at each of the first interface and the second interface is changed from an ohmic contact to a Schottky contact.

6. The electronic device of claim 1, wherein each of the first and second operating electrode layers includes metal that forms metal hydride.

7. The electronic device of claim 6, wherein the metal that forms the metal hydride includes palladium (Pd), or a palladium (Pd)-based bimetallic compound.

8. The electronic device of claim 1, wherein the channel layer includes carbon nanotubes.

9. The electronic device of claim 1, wherein the channel layer includes at least one carbon nanotube that directly connects the first operating electrode layer to the second operating electrode layer.

10. The electronic device of claim 9, wherein the at least one carbon nanotube has a length equal to or less than a mean free path of a hole that conducts between the first operating electrode layer and the second operating electrode layer.

11. The electronic device of claim 1, wherein the first and second operating electrode layers and the channel layer are disposed on the same plane.

12. The electronic device of claim 1, wherein the proton conductive layer includes at least one of a proton exchange polymer, a metal-organic framework, a covalent-organic framework, sulfonated graphene, and polymer-graphene composites.

13. The electronic device of claim 1, wherein the hydrogen source layer includes metal hydride or hydrogen-containing semiconductor material.

14. The electronic device of claim 1, further comprising a separating insulation layer disposed between the base electrode layer and each of the first and second operating electrode layers and the channel layer.

15. An electronic device comprising:
a substrate;
first and second operating electrode layers disposed over the substrate to be spaced apart from each other;
a channel layer disposed between the first operating electrode layer and the second operating electrode layer over the substrate;
a proton conductive layer disposed over the first and second operating electrode layers and the channel layer; and
a control electrode layer disposed over the proton conductive layer,
wherein each of the first and second operating electrode layers comprises metal having a work function that changes according to acceptance or release of hydrogen (H),
wherein the channel layer comprises at least one carbon nanotube having a work function that remains unchanged according to acceptance or release of hydrogen (H), and
wherein the at least one carbon nanotube electrically connects the first operating electrode layer and the second operating electrode layer, and contacts both the first and second operating electrode layers.

16. The electronic device of claim 15, wherein electrical conductivity of the channel layer conducting a conductive carrier between the first operating electrode layer and the second operating electrode layer is changed depending on whether the first and second operating electrode layers accept or release the hydrogen (H).

17. The electronic device of claim 16, wherein the conductive carrier is a hole having a positive charge.

18. The electronic device of claim 15, wherein with respect to a hole, each of an electrical contact at an interface formed between the first operating electrode layer and the channel layer and an electrical contact at an interface formed between the second operating electrode layer and the channel layer is changed from an ohmic contact to a Schottky contact.

19. The electronic device of claim 15, wherein each of the first and second operating electrode layers includes metal that forms metal hydride.

20. The electronic device of claim 19, wherein the metal that forms the metal hydride include palladium (Pd), or a palladium (Pd)-based bimetallic compound.

21. The electronic device of claim 15, wherein the channel layer includes carbon nanotubes.

22. The electronic device of claim 15, wherein the channel layer includes at least one carbon nanotube that directly connects the first operating electrode layer to the second operating electrode layer.

23. The electronic device of claim 22, wherein the at least one carbon nanotube has a length equal to or less than a mean free path of a hole that conducts between the first operating electrode layer and the second operating electrode layer.

24. The electronic device of claim 15, wherein the proton conductive layer includes at least one of a proton exchange polymer, a metal-organic framework, a covalent-organic framework, sulfonated graphene, and polymer-graphene composites.

25. The electronic device of claim 15, wherein the proton conductive layer includes hydrogen (H) exchanged with the first and second operating electrode layers.

26. The electronic device of claim 15, further comprising a hydrogen source layer disposed between the proton conductive layer and the control electrode layer.

\* \* \* \* \*